(12) United States Patent
Galler et al.

(10) Patent No.: US 11,653,569 B2
(45) Date of Patent: May 16, 2023

(54) DEVICE PROVIDING HAPTIC FEEDBACK, AND COMPONENT COMPRISING SAID DEVICE

(71) Applicant: TDK Electronics AG, Munich (DE)

(72) Inventors: Martin Galler, Munich (DE); Harald Kastl, Bad Gams (AT)

(73) Assignee: TDK Electronics AG, Munich (DE)

( * ) Notice: Subject to any disclaimer, the term of this patent is extended or adjusted under 35 U.S.C. 154(b) by 768 days.

(21) Appl. No.: 16/462,046

(22) PCT Filed: Nov. 21, 2017

(86) PCT No.: PCT/EP2017/079898
§ 371 (c)(1),
(2) Date: May 17, 2019

(87) PCT Pub. No.: WO2018/095900
PCT Pub. Date: May 31, 2018

(65) Prior Publication Data
US 2019/0334077 A1    Oct. 31, 2019

(30) Foreign Application Priority Data
Nov. 23, 2016  (DE) .......................... 102016122610.6

(51) Int. Cl.
*H01L 41/08* (2006.01)
*G06F 3/01* (2006.01)
(Continued)

(52) U.S. Cl.
CPC .......... *H01L 41/0825* (2013.01); *G06F 3/016* (2013.01); *H01L 41/0474* (2013.01);
(Continued)

(58) Field of Classification Search
CPC ... H01L 41/0825; H01L 41/083; H02N 2/043; H02N 2/18
See application file for complete search history.

(56) References Cited

U.S. PATENT DOCUMENTS 5,729,077 A    3/1998  Newnham
6,597,677 B1   7/2003  Segawa
(Continued)

FOREIGN PATENT DOCUMENTS

CN    1241104 A    1/2000
CN    1243406 A    2/2000
(Continued)

OTHER PUBLICATIONS

International Search Report for International Application No. PCT/EP2017/079898, dated Mar. 1, 2018, with English translation (5 pages).

(Continued)

*Primary Examiner* — Bryan P Gordon
(74) *Attorney, Agent, or Firm* — Nixon Peabody LLP

(57) ABSTRACT

A device having a piezoelectric actuator, which can both detect the actuation force and provide a haptic feedback. The linear expansion of the actuator can be amplified in the desired direction by a deformable metal sheet. The actuator has a flat piezoelectric basic body having plane-parallel main surfaces and two electrodes. The body is designed to generate an active haptic feedback when a force exerted upon the basic body is detected. The haptic feedback is generated in that an actuator voltage, which, by piezoelectric actuator action, results in a change in the length of the basic body, is applied between the electrodes. A cymbal-shaped metal sheet is fastened to the basic body. The body is fixed with the truncated cone vertices between a base and an (Continued)

actuation means connected to the base and fixed by means of a bias, which is set as tensile or compressive stress.

17 Claims, 4 Drawing Sheets

(51) Int. Cl.
*H01L 41/047* (2006.01)
*H01L 41/083* (2006.01)
*H02N 2/04* (2006.01)
*H02N 2/18* (2006.01)

(52) U.S. Cl.
CPC ........... *H01L 41/083* (2013.01); *H02N 2/043* (2013.01); *H02N 2/18* (2013.01)

(56) References Cited

U.S. PATENT DOCUMENTS

| | | | |
|---|---|---|---|
| 6,798,888 | B1 | 9/2004 | Howarth |
| 7,379,392 | B1* | 5/2008 | Benjamin ............ G10K 11/006 367/154 |
| 2002/0115960 | A1 | 8/2002 | Redding |
| 2005/0057123 | A1 | 3/2005 | Deng |
| 2006/0028095 | A1 | 2/2006 | Maruyama |
| 2010/0328242 | A1 | 12/2010 | Paleczny et al. |
| 2011/0127881 | A1 | 6/2011 | Howarth |
| 2011/0193824 | A1 | 8/2011 | Modares |
| 2011/0310055 | A1 | 12/2011 | An |
| 2012/0019103 | A1 | 1/2012 | Matsui |
| 2012/0274599 | A1 | 11/2012 | Schediwy |
| 2015/0122621 | A1 | 5/2015 | Fukumoto |
| 2015/0171310 | A1* | 6/2015 | Kubota ................. H01L 41/083 15/94 |
| 2015/0171311 | A1* | 6/2015 | Kubota ................. H02N 2/163 347/68 |
| 2015/0187349 | A1* | 7/2015 | Schafer ................. G10K 9/121 367/189 |
| 2017/0365770 | A1* | 12/2017 | Abergel .............. H01L 41/0973 |
| 2019/0196597 | A1* | 6/2019 | Rinner ................... H02N 2/043 |
| 2019/0334077 | A1 | 10/2019 | Galler |

FOREIGN PATENT DOCUMENTS

| | | |
|---|---|---|
| CN | 204167367 U | 2/2015 |
| CN | 105706206 A | 6/2016 |
| DE | 202008017833 U1 | 8/2010 |
| DE | 102015117262 A1 | 4/2017 |
| EP | 2123537 A1 | 11/2009 |
| JP | H 6-338640 A | 12/1994 |
| JP | H 11-212725 A | 8/1999 |
| JP | 2000-003253 A | 1/2000 |
| JP | 2000032531 A | 1/2000 |
| JP | 2000032534 A | 1/2000 |
| JP | 2000032535 A | 1/2000 |
| JP | 2000032536 A | 1/2000 |
| JP | 2000032538 A | 1/2000 |
| JP | 2004-518455 A | 6/2004 |
| JP | 2006173219 A | 6/2006 |
| JP | 2012-029381 A | 2/2012 |
| KR | 20120125624 A | 11/2012 |
| WO | WO 1997/022154 A1 | 6/1997 |
| WO | 2014008401 A1 | 1/2014 |
| WO | WO 2015/069554 A1 | 5/2015 |
| WO | 2016156175 A1 | 10/2016 |
| WO | 2016175986 A1 | 11/2016 |
| WO | WO 2017/060011 A1 | 4/2017 |

OTHER PUBLICATIONS

Written Opinion of the International Searching Authority for International Application No. PCT/EP2017/079898, dated Mar. 1, 2018, with English translation (13 pages).

* cited by examiner

DEVICE PROVIDING HAPTIC FEEDBACK, AND COMPONENT COMPRISING SAID DEVICE

CROSS-REFERENCE TO RELATED APPLICATIONS

This application is a U.S. National Stage of International Application No. PCT/EP2017/079898, filed Nov. 21, 2017, which claims the benefit of German Patent Application No. 102016122610.6, filed Nov. 23, 2016, both of which are incorporated herein by reference in their entireties.

The present invention relates to a component and a device for generating an active haptic feedback. The device in this case is a device designed to generate a feedback to a user when the latter exerts a force upon the component. Such a component may be inserted, for example, in a button, e.g. in an actuation button for instruments. The component may generate the active haptic feedback, for example, in order to communicate to a user, for example, that settings performed by the latter are successfully implemented by the component.

Conversely, components may also give active haptic feedback, for example mobile telephones may generate vibration alarms. Tactile displays for mobile electronic devices such as notebooks, etc. are also known. The tactile feedback may also convert the strength of forces, or the quality of surfaces, or the stiffness or elasticity of materials into a sensation that can be perceived in a tactile manner.

The object of the present invention is to specify an improved device for generating an active haptic feedback.

This object is achieved by a devices according to the present claim 1. Advantageous designs of the invention are disclosed by the further claims.

Specified is a device for generating an active haptic feedback. It comprises a piezoelectric actuator for generating a feedback in the form of a perceptible deflection. The actuator comprises a flat piezoelectric basic body having approximately plane-parallel main surfaces. Provided in the basic body are first and second actuator electrodes, by means of which a piezoelectric deflection of the piezoelectric actuator can be effected.

The basic body is furthermore designed such that it generates a haptic feedback when a force exerted upon the basic body is detected. To generate the haptic feedback, an actuator voltage, which effects the piezoelectric deflection and results in a change in the length of the basic body, is then applied between the first and second actuator electrodes.

For better perception of the actuator action, in particular the change in the length of the basic body is preferably effected parallel to the force exerted, i.e. along a normal to a main surface of the actuator. It is also possible for a change in length to be deflected in a direction perpendicular thereto, by suitable geometric measures in the device.

The piezoelectric basic body is thus, on the one hand, part of the piezoelectric actuator, the actuator action of which is a piezoelectric deflection. Furthermore, in addition, owing to the piezoelectric properties of the basic body, the force exerted upon this basic body can also be detected and converted into an electrical signal.

The feedback is called an active feedback because it is generated by the device itself. The feedback is called a haptic feedback because it can be perceived by a user via the user's sense of touch.

If a voltage is applied to the actuator electrodes, the basic body generates a linear expansion. The linear expansion may be effected perpendicularly in relation to the normal, the normal being perpendicular to the main surface of the basic body. Such a linear expansion is also called a transverse contraction. The direction of the linear expansion in this case is dependent on the polarity of the applied voltage and on the polarization of the piezoelectric material.

Since a transverse contraction is not easily perceptible by a user exerting a force parallel to the normal, the device is advantageously designed to convert the change in the length of the basic body from a direction perpendicular to the normal into a linear expansion of the basic body that is parallel to the normal.

The conversion is effected in that, according to one embodiment, there is a truncated-cone-shaped metal sheet fastened to both main surfaces of the basic body, the truncated "cone vertices" in each case facing away from the basic body. The metal sheet is designed to transform a linear expansion of the basic body that is vertical to the normal into a change in length that is parallel to the normal. The metal sheet may furthermore serve to amplify a change in the length of the basic body, parallel to the normal, that is effected as a result of the transverse contraction of the basic body. The metal sheet bent or shaped in the form of a truncated cone can take up a transverse contraction, and in this case deforms in the desired direction, namely parallel to the normal. This deformation in this case may turn out to be more pronounced than the piezoelectric deflection in the same direction. An easily perceptible change in the length of the entire device is therefore effected by means of the truncated-cone-shaped metal sheet on both main surfaces of the basic body.

In order for the metal sheet to be noticeably elastically deformable under actuator action, it may have a typical thickness that, e.g. in the case of titanium, is in the range of between 0.1 mm and 0.4 mm.

The basic body having the two truncated-cone-shaped metal sheets is advantageously fixed, via its truncated cones, between a base and an actuation means. The actuation means, in turn, is connected to the base and is fixed by means of a bias, which is set as tensile or compressive stress and provided, for example, by means of springs.

In the simplest embodiment, the actuation means is realized as an actuation plate, which is aligned parallel to the surface of the basic body, and thus parallel to the base. It lies on the top surface of the upper truncated-cone-shaped metal sheet, and is preferably freely movable relative to the base. The actuation plate projects over the basic body, at least one two sides, preferably on all sides, and in the projecting region is connected to the base via springs, the springs being biased. It is thereby ensured that a pressure acting upon the actuation plate, for example the finger pressure of a user, is reliably picked up, and at least the force component acting parallel to the normal is transmitted to the basic body. The actuation plate may be designed such that, in the case of an actuation/application of force not acting vertically, it can tilt slightly, and nevertheless transmits the force to the basic body. The spring bias causes the actuation plate to be again aligned parallel to the base, or parallel to the main surface of the basic body, following deflection.

Alternatively, the actuation means is realized as a membrane, which is connected to the base such that it exerts a force or bias, acting in the direction of the base, upon the basic body provided in each case with two truncated-cone shaped metal sheets on the main surfaces.

If the membrane is realized with sufficient elasticity, it is can also be excellent in picking up a deformation that is necessarily effected by actuation of the device for generating an active haptic feedback. Likewise, the elasticity of the membrane allows the device to deform back again into the initial position.

In an alternative embodiment, the basic body is fixed, via its truncated-cone-shaped metal sheets, between the base and an actuation means realized as an actuation plate, a spring pressure, acting in the direction of the base, being exerted upon the actuation plate. This spring pressure may be generated by means of helical springs, which are supported on a bracket that is fastened to the base and arranged such that it projects vertically, with one bracket end, over the basic body. The bracket may also be a rail having, for example, a double-bend cross-sectional profile. A lower flat part may be fastened to the base, while the upper flat part projects over the basic body. Instead of a bracket, the holding element may also be realized as a sleeve having a flanged-over rim, the sleeve then simultaneously constituting a guide for the linear expansion of the entire device. The helical springs, under compressive stress between the sleeve, or bracket, and the actuating plate, in this case effect secure holding and return to an initial position following actuation of the device, or following deflection of the piezoelectric actuator.

The truncated-cone-shaped metal sheet has a peripheral region that lies flatly on and is fastened to one of the main surfaces of the basic body. Furthermore, the truncated cone has a circumferential surface that projects over the respective main surface in the direction of the normal. At the truncated cone vertex the metal sheet has a top face that is aligned approximately parallel to the surface of the basic body.

The truncated-cone-shaped metal sheet therefore preferably has a round footprint, by means of which changes in length parallel to the main surface can best be picked up, irrespective of the angle in relation to the basic body, and can be amplified by deformation of the metal sheet in a direction parallel to the normal.

The device according to the invention generates a haptic feedback when a force exerted upon the basic body, or upon the device, is detected. The detection may be effected by means of the inverse piezoelectric effect. The force exerted upon the basic body by means of the actuator electrodes generates a charge transfer, which can be tapped, as a measurement voltage, at electrodes. In principle the actuator electrodes may be used for this purpose.

It is also possible, however, to arrange at least one separate measuring electrode in the basic body, and by means of this measuring electrode sense the measurement voltage that is generated, because of the inverse piezoelectric effect, by the exerted force. Since the measurement voltage increases with increasing exerted force, a threshold value, which is assigned to the desired tripping force, can be defined for the measurement voltage to be sensed. If the exerted force attains the tripping force and the measurement voltage in this case exceeds the threshold value, this is detected by a measuring unit that is connected to the measuring electrodes. Upon attainment of the tripping force, an actuator voltage is then generated by means of a voltage generator and applied to the actuator electrodes. At the same time, a further action is tripped, which serves to operate the device or an electrical component connected thereto.

The device thus practically constitutes a manual switch, the tripping point of which can be set via the threshold value. At the same time, the switch generates a haptic feedback from which the user exerting the force, for example by means of a finger pressure, detects the attainment of the tripping force, and thus the switching operation. It is also possible to define a plurality of threshold values, and to generate differing haptic feedback by means of a control system, such that differing tripping forces can be detected, converted into differing actions and communicated, via differing feedback, to the user.

As stated, the actuator electrodes may serve as measuring electrodes. A third electrode may also be used as a measuring electrode, and the measurement voltage tapped between the measuring electrode and an actuator electrode. It is also possible, however, to provide two separate measuring electrodes in the basic body.

The at least one measuring electrode that is different from the actuator electrodes may be arranged in the middle of the basic body, between first and second actuator electrodes. It is also possible, however, to arrange the at least one measuring electrode close to one of the two main surfaces, such that all other first and second actuator electrodes are arranged on the same side of the measuring electrode in the basic body.

The distance between the measuring electrodes, or between the electrodes used as measuring electrodes, of which at least one may be an actuator electrode, may advantageously be selected so as to be greater than the distance between the electrodes used exclusively as first and second actuator electrodes. A greater distance between the measuring electrodes, between which piezoelectric material is also arranged, has the result that a greater voltage is generated, for the same force acting upon the piezoelectric element formed between the measuring electrodes, than between the pure actuator electrodes. A greater generated measurement voltage has the advantage that it is possible to detect a lesser threshold value for the measurement voltage that is assigned to the tripping force.

For the purpose of generating a perceptible deflection, a device according to the invention requires a particular number of piezo elements stacked on top of each other, or a corresponding number of first and second actuator electrodes, which are arranged alternately, such that a piezo element is realized between, respectively, one first and one second actuator electrode. For the same overall height of the basic body, or for the same overall layer thickness of the individual piezo elements, the number of piezo elements can be used to set the actuator voltage that is required to attain a particular linear expansion. A large layer thickness between two actuator electrodes requires a high voltage for deflection. Many small, stacked piezo elements require a lesser voltage, and nevertheless generate the same expansion if the overall height of the piezoelectrically active layers corresponds.

First and second actuator electrodes are preferably arranged alternately, and are routed outwardly, at differing sides of the basic body, to an outer contact. The actuator voltage can then be applied to the two outer contacts. In a corresponding manner, the at least one measuring electrode can also be connected to an outer contact. However, a single piezoelectric element, between the two electrodes of which the measurement voltage is produced, because of the inverse piezoelectric effect, is sufficient for detecting the exerted force.

A basic body used in the device according to the invention has a dimension, in the direction of its normal, that is small relative to the dimension vertical thereto. It is therefore a flat basic body. For example, the maximum extent of the basic body, in a direction perpendicular to the normal, may be more than ten times as great as the height of the basic body measured in the direction of the normal. The length of the basic body may also exceed the height of the basic body by a factor of 20 or more.

The linear expansion of the basic body resulting from the piezoelectric effect is relatively small, and is only approximately 0.1 percent of the entire piezoelectrically effective height. The extent of the linear expansion in the direction of the normal is amplified by the truncated-cone-shaped metal sheets.

The total extent of the device according to the invention may be further amplified if a plurality of devices are stacked on top of each other. A number of two or more basic bodies, each provided with two truncated-cone-shaped metal sheets on the main surfaces, are thus stacked on top of each other, and preferably fixed between an actuation means and a base. This may be effected, for example, by means of helical springs, which exert a tensile or compression stress and thus pull or press the actuation means, and in particular the actuation plate, in the direction of the base plate.

Alternatively, the actuation means is realized as a membrane, which is connected to the base such that it exerts a force or bias, acting in the direction of the base, upon the base body or bodies that are each provided with two truncated-cone-shaped metal sheets on the main surfaces.

In the case of a plurality of basic bodies stacked on top of each other, the actuation plate is particularly advantageous, since it simultaneously constitutes an improved holder for the basic body, and thus the stack of different basic bodies on top of each other is prevented from tilting sideways. It is even more preferable and advantageous, however, if the basic bodies stacked on top of each other are guided in a type of sleeve, in which the actuation plate can move freely in the direction of the normal. A flanged-over rim of the sleeve, on the side of the sleeve that is distant from the base, can simultaneously serve to clamp-in a spring, under compressive stress, between the rim and the actuation plate. Biased by a helical spring under tension, however, the actuation plate can also move in the sleeve. The said projecting upper rim of the sleeve may serve as a stop for the linear expansion parallel to the normal.

The device according to the invention may be realized as an actuation button, by which a function of an electrical component can be switched. The switching operation is then effected upon attainment and detection of the defined tripping force, the switching operation being preformed either directly by the measuring unit or by a control unit connected thereto. The control unit may also comprise the voltage generator.

The invention is explained in greater detail in the following on the basis of exemplary embodiments and the associated figures. The figures in this case are merely schematic, and are not true to scale. To aid comprehension, therefore, individual dimensions may be represented in enlarged or reduced form.

FIG. 1 shows a simple piezoelectric basic body GK, having a first and a second actuator electrode E1, E2.

The basic body GK is produced, for example, in the form of piezoelectric layers stacked on top of each other, each of which are, or can be, printed with electrode material.

The layers are preferably inserted as ceramic green films and printed with a burn-in electrode paste for the actuator electrodes. After a desired quantity of layers have been stacked on top of each other, they are finally sintered together to form a monolithic block—the basic body. The actuator (=basic body with actuator electrodes) comprises a piezoceramic, for example based on PZT (lead zirconate titanate). The PZT ceramic may also additionally contain Nd and Ni. Alternatively, the PZT ceramic may also additionally comprise Nd, K and possibly Cu. Alternatively, the piezoelectric layers may have a composition containing $Pb(Zr_xTi_{1-x})O_3 + y\ Pb\ (Mn_{1/3}Nb_{2/3})\ O_3$. The piezoelectric layers may be polarized such that the change in the length of the basic body is caused by the application of an alternating voltage between the first and the second inner electrodes and the piezoelectric effect associated therewith.

The basic body is arranged on a base B, which forms, for example, a surface of an electrical component. The stacking direction of the individual layers corresponds to the surface normal N of the basic body. The force F exerted on the piezo actuator acts with its component that acts vertically in relation to the surface, or parallel to the normal N. Only this force is converted into a voltage, which can be tapped at the actuator electrodes E1, E2, or a measuring electrodes, which are not shown in the figure.

For the purpose of generating the haptic feedback, an actuator voltage, which results in a change in the length of the basic body GK, is applied between the first actuator electrode E1 and the second actuator electrode E2. By corresponding poling of the piezoelectric basic body, the change in length caused thereby can be effected parallel to the normal, i.e. in the direction opposite to the exerted force F, such that it can best be perceived by a user.

Figure 1:
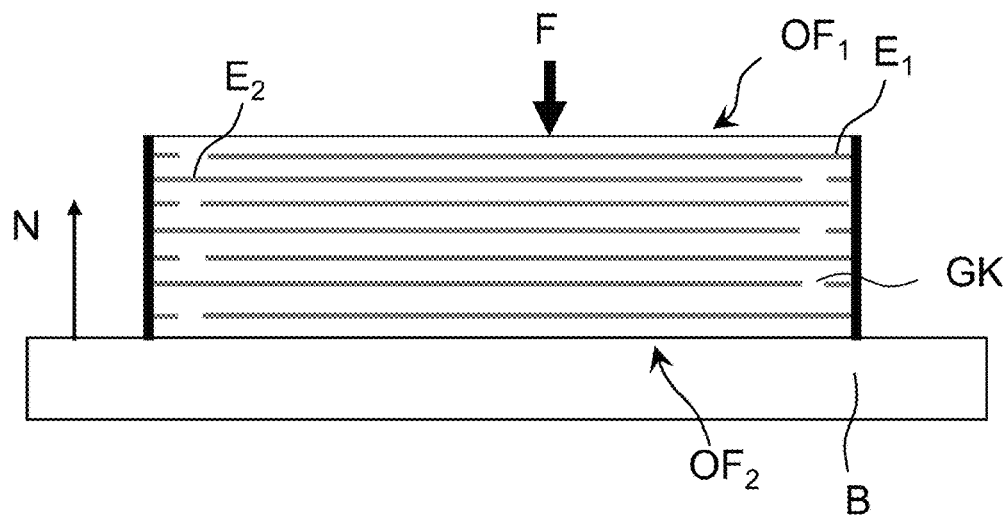
FIG. 1 shows a basic body functioning as an actuator, in a schematic cross section.
Figure 2:
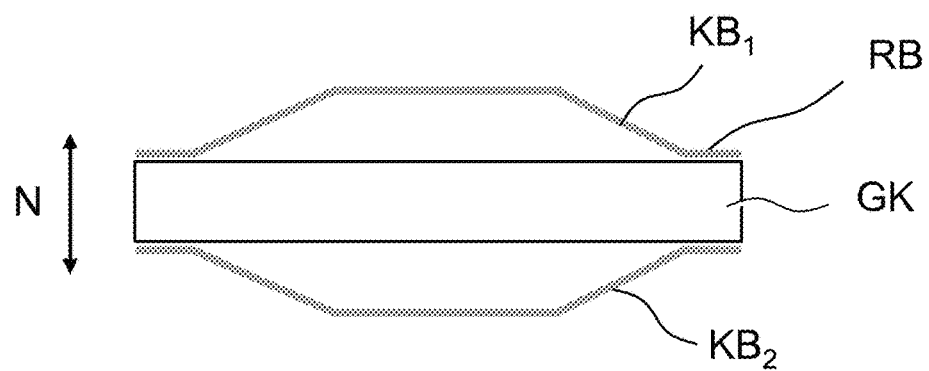
FIG. 2 shows a basic body provided with truncated-cone-shaped metal sheets.

FIG. 2 shows, on the basis of a schematic cross section, how the linear expansion of the device as a whole can be amplified in the direction of the normal. Mounted on both main surfaces of the basic body GK is a respective truncated-cone-shaped metal sheet KB1, KB2. For this purpose, a flat peripheral region, which can lie flatly on the main surface of the basic body GK, is fixedly connected to the latter. The peripheral region may be fastened, for example, by means of adhesive bonding, soldering or welding to the basic body. Owing to the special shape, in particular owing to the circumferential surfaces and the top face of the truncated cone, a transverse contraction of the basic body GK is converted directly into a deformation of the metal sheet that is parallel to the normal N.

The metal sheet may comprise titanium as a material, or be composed of titanium. Particularly for the present application of the device for generating an active haptic feedback, titanium has significant advantages. Moreover, titanium has a coefficient of thermal expansion that is very close to the coefficient of thermal expansion of the basic body. As a result, the point of connection of the metal sheet to the basic body does not undergo significant mechanical loading upon a change of temperature. For example, both the metal sheet and the basic body may have a coefficient of thermal expansion of between 8 and 9 ppm/K.

Figure 3A:
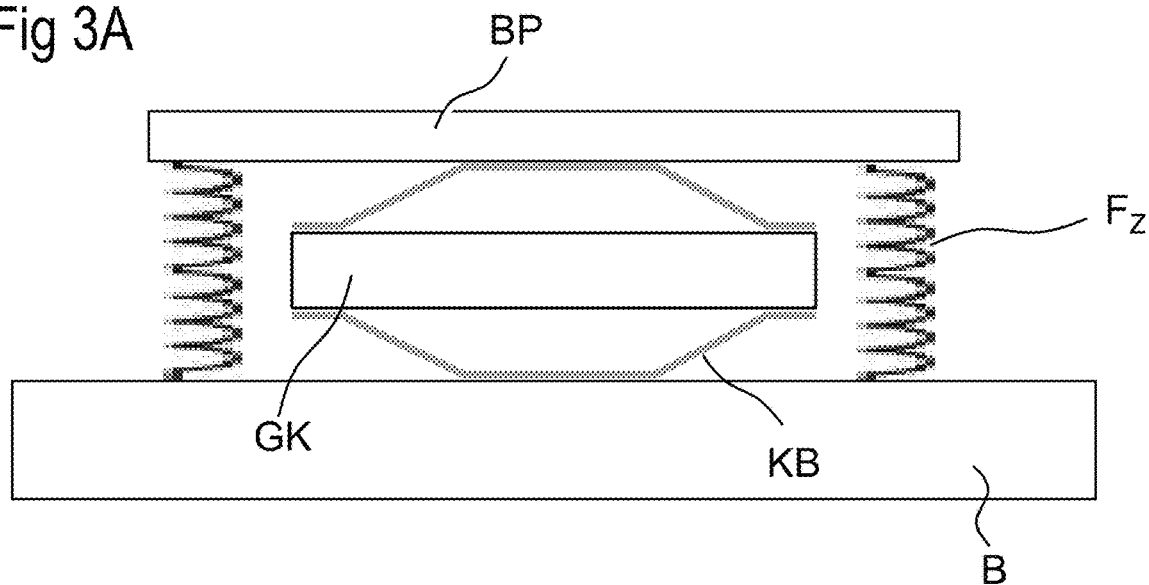
FIG. 3A shows a basic body that is tensioned, by means of tension springs, between an actuation plate and the base.

FIG. 3A shows an embodiment of the device according to the invention in which the piezo actuator, or the basic body GK, is fixed, with the two truncated-cone-shaped metal sheets KB1, KB2, between the base B and an actuation plate BP. The fixing is effected by helical springs $F_z$, by means of which the actuation plate BP is drawn in the direction of the base B and thus fixes the basic body GK. In this way, the ceramic basic body can move unhindered, and there is no need for the ceramic of the basic body to be fastened on the base or to a surface that is to be moved. This allows full utilization of the transformation capability of the two truncated-cone-shaped metal sheets, and thereby at the same time reduces the risk of damaging the ceramic, or basic body. Owing to the tensioning via the springs FZ, a direct contact is always achieved between the truncated-cone-shaped metal sheets and the actuation plate, or the base, and ensured over the service life and the operating conditions in which the device is operated.

The actuation plate BP is, for example, rectangular, and made from aluminum. It has a mechanical stability, or thickness, that is sufficient for the acting forces. However, it may also be made from other materials, e.g. from metal, plastic, ceramic, glass or wood. It is realized in this case such that the haptic feedback can be transmitted with as little interference as possible, or without damping. This necessitates a material having a certain hardness, or a high modulus of elasticity.

The actuation plate BP has a larger footprint than the basic body GK, and preferably projects over the periphery of the latter on all sides. A secure fixing is achieved by means of at least two springs $F_z$. However, it is advantageous to use a greater number of springs $F_z$, to enable a symmetrical tensioning to be achieved. The springs $F_z$ are then distributed in a uniform manner over the circumference of the actuation plate.

Figure 3B:
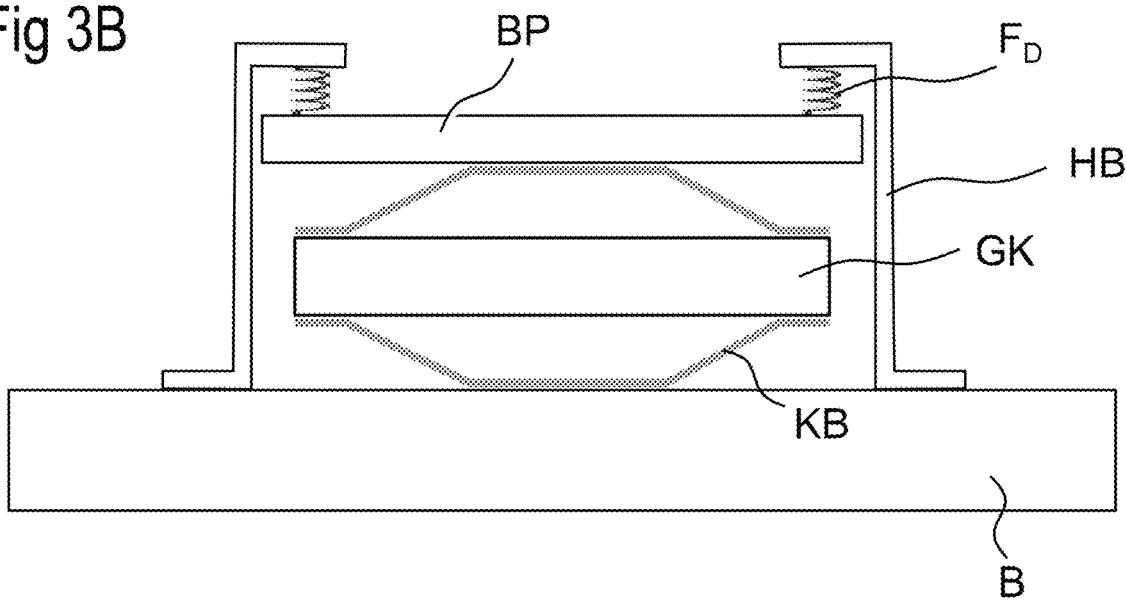
FIG. 3B shows a basic body that is tensioned, by means of compression springs, between an actuation plate and the base.

Advantages similar to those of the embodiment according to FIG. 3A are achieved with a further embodiment according to FIG. 3B. In this embodiment, the basic body GK is likewise fixed under pressure, with the two truncated-cone-shaped metal sheets KB, between the actuation plate BP and the base B, but with the pressure for fixing acting from above upon the actuation plate BP, by means of helical springs $F_D$. The helical springs $F_D$ are clamped-in under compressive stress between the actuation plate and holding brackets HB. The holding brackets HB project over the actuation plate BP, and form a placement point there for the springs $F_D$.

In FIG. 3B the bracket is represented in cross section. A single holding bracket may be used for each spring. However, it is advantageous to use a bracket strip, having a cross section represented in FIG. 3B, or similar, to which a plurality of springs $F_D$ can be applied.

It is preferable if the rail, which in cross section forms the holding bracket HB, extends around the actuation plate, such that the actuation plate is held, as it were, as in a sleeve with an open holding bracket. This embodiment has the advantage that a secure hold is still ensured even in the case of a large deflection. Whereas the springs $F_z$, under tensile stress, of the embodiment according to FIG. 3A might possibly become over over-stretched, resulting in a weaker or decreasing fixing, the embodiment according to FIG. 3B provides, by means of the holding bracket HB, a stop that prevents an excessive upward excursion of the actuation plate BP.

Figure 4:
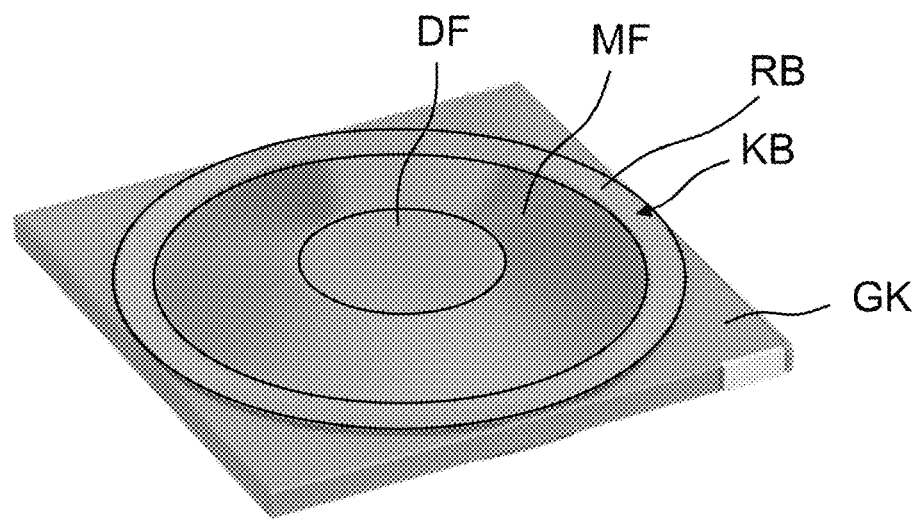
FIG. 4 shows a three-dimensional representation of a device according to the invention, in top view.

FIG. 4 shows a three-dimensional representation of a device according to the invention, in an oblique top view. The basic body GK advantageously has a square footprint, while the truncated-cone-shaped metal sheet KB has a round footprint which, with its peripheral region, is fastened centrally on the surface of the basic body GK. In the region of the circumferential surface MF, the truncated-cone-shaped metal sheet extends upward and tapers radially, such that the top face DF likewise has a round footprint. The top face DF may be planar, but may also have a finger-shaped depression in the direction of the basic body, in order to match the finger shape of a user.

Figure 5:
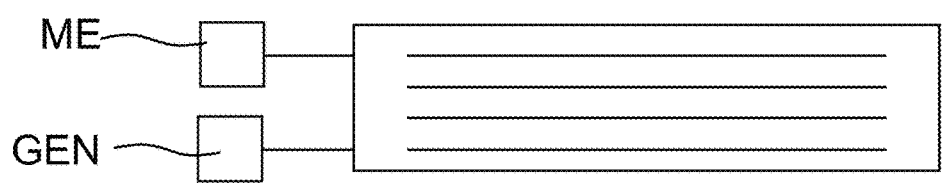
FIG. 5 shows a basic body with a measuring unit and a generator.

FIG. 5 shows a basic body GK in a schematic cross section. It shows the actuator electrodes E1, E2 which, as inner electrodes, are aligned parallel to each other and parallel to the main surfaces of the basic body, equidistant from each other. A special measuring electrode, which may be at a greater distance from the adjacent actuator electrode, is not represented. Likewise not represented is the connection of the actuator electrodes to outer contacts, via which the actuator electrodes can be interconnected in parallel. For this purpose, the inner electrodes may be extended in the form of a web as far as the periphery of the basic body, and there contact one of the two terminal contacts. This leading-out of the inner electrodes to the edges of the basic body GK is effected, alternately for first and second actuator electrode, to differing terminal contacts, such that all first and second actuator electrodes can be contacted via a total of two terminal contacts.

At least two of the inner electrodes of the basic body are connected to a measuring unit ME, which can detect a voltage that acts as a result of a force being exerted vertically upon a main surface of the basic body and that is generated by the inverse piezoelectric effect in the piezoelectric ceramic. A voltage generator GEN is connected to the two outer contacts of first and second actuator electrodes E1, E2. If the measuring unit ME detects the attainment of a tripping force, which manifests itself in the exceeding of the generated measurement voltage, an actuator voltage is generated by the voltage generator GEN and applied to first and second actuator electrodes. The latter, in turn, result in the deflection of the basic body, which is detected by the user as haptic feedback.

In order to amplify the perception, the voltage applied to the actuator electrodes may be modulated in the form of differing, successive pulses. Their sequence frequency is then selected such that the feedback can be perceived by the user as a vibration. It is also possible for an alternating voltage of suitable frequency to be applied to the actuator electrodes. Furthermore, it is possible that a plurality of threshold values, which can generate differing feedbacks in succession, are defined in the measuring unit and in the control unit connected thereto. Differing feedbacks may differ in the frequency, or generally in the length, sequence frequency or number of pulses. In parallel with this, the device may then trip differing actions, depending on the threshold value attained.

Figure 6A:
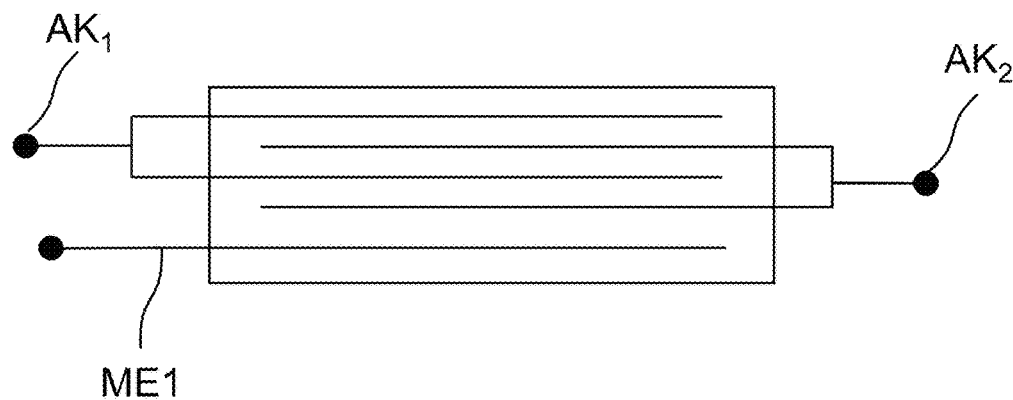
FIGS. 6A and 6B show two different arrangements of actuator electrodes and measuring electrodes, on the basis of a schematic cross section through the basic body.

FIG. 6A shows a possible arrangement of the measuring electrode ME in the basic body GK, such that all actuator electrodes are arranged on one side of the measuring electrode. The measuring electrode can then be arranged close to a main surface of the basic body.

Figure 6B:
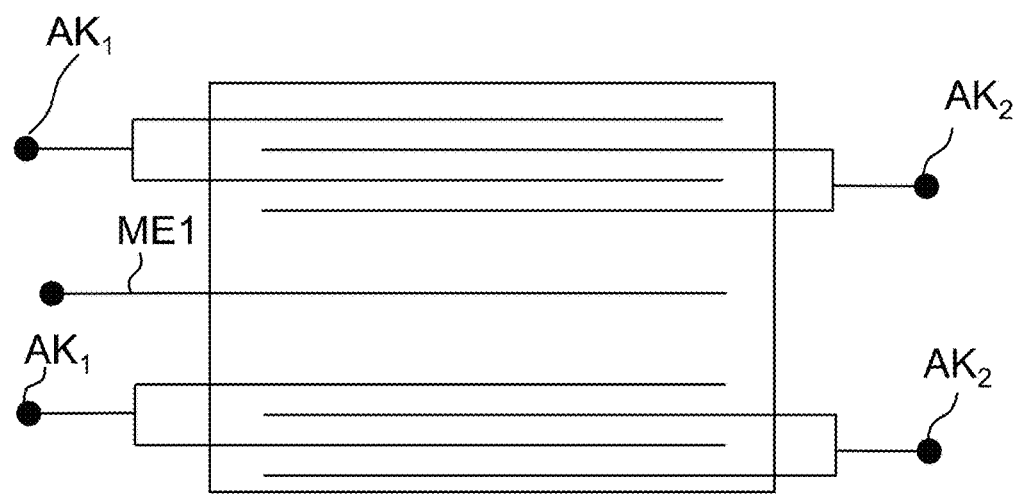

FIG. 6B shows, on the basis of a schematic cross section, how the measuring electrode is arranged in the middle of the basic body, between the actuator electrodes E1, E2. A greater distance may be provided between a measuring electrode ME and actuator electrodes E than between actuator electrodes of differing polarity. The first actuator electrodes E1 are connected to a first outer contact Ak1, the second actuator electrodes E2 being connected to a second outer contact AK2.

Figure 7:
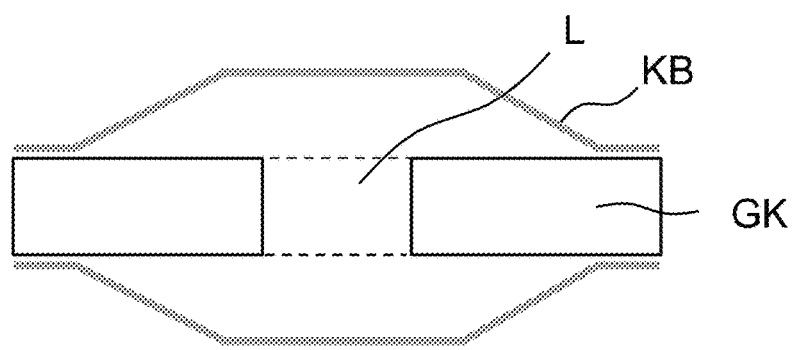
FIG. 7 shows a device according to the invention having a basic body that has an opening in the form of a through-hole.

FIG. 7 shows a further embodiment of the invention, in which ceramic basic bodies, i.e. the piezoelectric material of the basic body, has a through-opening in the center, preferably in the form of a cylindrical through-hole L. The peripheral region of the truncated-cone-shaped metal sheet KB is fastened to the main surfaces of the basic body, at a sufficient distance from the edges of the hole. The hole has the advantage that it reduces the capacitance of the piezoelectric actuator that builds up between the actuator electrodes, and thus it is possible for the actuator to function with lesser power, without alteration of the magnitude of the linear expansion.

Figure 8:
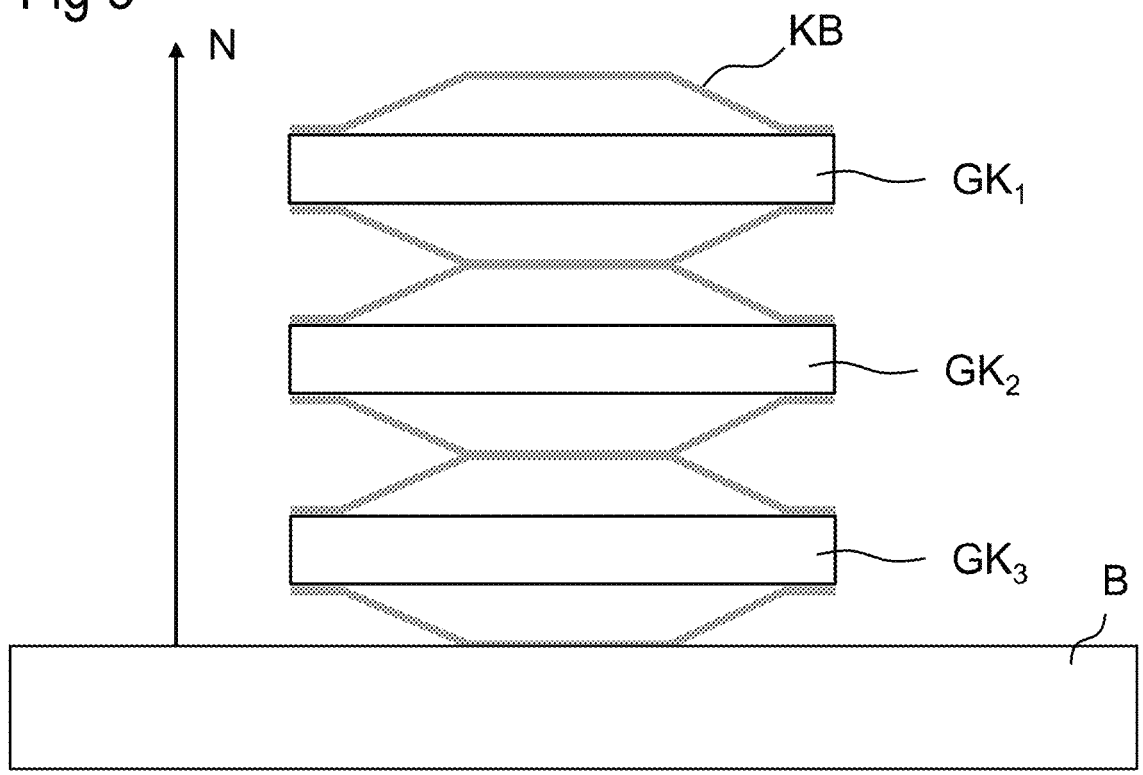
FIG. 8 shows a device according to the invention in which a plurality of basic bodies are stacked and fixed on top of each other.

FIG. 8 shows a further embodiment, in which a plurality of devices, comprising basic bodies GK that are each provided with two truncated-cone-shaped metal sheets KB, are stacked vertically on top of each other, such that the lateral edges of all basic bodies are in alignment with each other, i.e. the footprints overlap 100 percent. Although not represented, in this embodiment it is particularly advantageous to fix a fixing of these devices, stacked on top of each other, by means of an actuation plate and by means of helical springs, against the base B, on which the stack is supported. It is advantageous here also to fix the basic bodies laterally by means of holding brackets, or to limit their lateral slippage by correspondingly closely positioned holding brackets or other stops. In this way, it is ensured that the basic bodies can move maximally, that the linear expansion is not impeded, and that the linear expansion of the individual devices adds additively to a total deflection parallel to the normal N, vertically above the surface of the base B.

Figure 9:
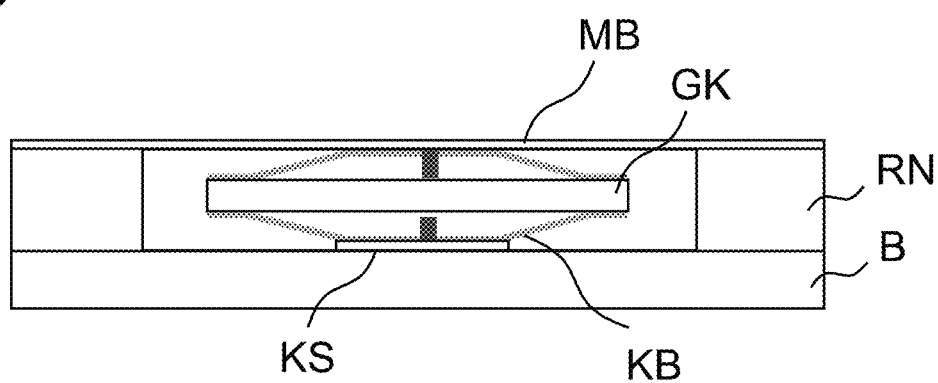
FIG. 9 shows a device according to the invention having a basic body, in which there is a membrane tensioned over the upper cymbal.

FIG. 9 shows a further exemplary embodiment of a device according to the invention, which has a basic body GK. There is a membrane MB tensioned over the upper cymbal KB. This membrane is thin and flexible. Owing to this tensioning and the elasticity, the membrane exerts a force, acting against the base B, that corresponds to a spring force. For the user, the membrane MB constitutes the visible, operable surface. This has the advantage that the operator interface has no gaps.

The membrane MB and the base B are fixedly connected to each other. This may be effected, for example, by a screwed connection (not represented in the figure). The membrane may also be tensioned over a frame RN, which is fixed on the base B. A flat operator interface is thereby obtained. At the same time, the thin membrane MB ensures that the haptic feedback is not weakened by the membrane. By contrast, the base is realized as a stiff element.

The structure shown ensures that, upon actuation of the device, the membrane MB undergoes deformation, and thus the strength of the haptic feedback is maximized for the user. In addition, the spring action of the membrane can be optimized by variation of the thickness or the connection between the membrane MB and the base B.

The membrane is advantageously realized such that it has a stiffness in the region of 1%-50% of the stiffness of the actuator.

In order to prevent the actuator from slipping during operation, it may additionally be fastened to the back wall (and/or membrane). A possible manner of fastening is fixing of the actuator by means of an adhesive layer KS.

Besides the embodiments, represented in particular in FIGS. 4 and 7, having a basic body of a rectangular or square footprint, it is also possible to realize the basic body with a round footprint. The square or rectangular embodiment has merely process-technology advantages, when the basic body is cut out of a larger-area stack, this being effected with straight cuts that result in rectangular or square footprints. Accordingly, a basic body may have a side length of between 10 and 30 mm, which may also correspond to the dimensions of a round embodiment of a basic body. In the direction of the normal, the basic body may have a height of between 0.5 and 2 mm. The truncated-cone-shaped metal sheet KB may be dimensioned such that the distance between the central region of the top face DF and the surface of the basic body is approximately 0.5 mm, when no force is exerted upon the component, and when no voltage is applied between first and second actuator electrodes.

The structure of the device is preferably symmetrical, such that an upper and lower truncated-cone-shaped metal sheet are symmetrical in relation to each other in their dimensions and arrangements. The truncated-cone-shaped metal sheet KB has a maximal extent relative to the footprint of the basic body, such that a maximal area is enclosed within the peripheral region that is supported on the main surface of the basic body. The actuator volume arranged between the two metal sheets is then also maximal. In this way, maximal detection of a transverse contraction can be achieved, or converted maximally into the desired deflection.

The invention could be presented on the basis of only a few exemplary embodiments, and is therefore not limited to the exact realization corresponding to the exemplary embodiments. It is within the scope of the invention to vary discretionally the number of terminal contacts or the number of basic bodies stacked on top of each other. The shape of the footprint is in first approximation also without relevance to the effectiveness of the device. The haptic feedback can be realized in a desired manner, and the deflection modulated accordingly. Furthermore, the tripping force can be set nearly arbitrarily, such that either only a slight touch, or up to a firm pressure, may be required to achieve the desired tripping force.

LIST OF REFERENCES

AA actuator deflection
AK outer contact
B base
BP actuation plate
DF truncated cone vertex=top face
E1, E2 first and second actuator electrode
F force exerted upon the actuator
$F_D$, $F_S$ spring with compressive or tensile stress
GEN voltage generator
GK piezoelectric basic body
HB holding bracket
KB truncated-cone-shaped metal sheet
L hole in basic body
MB membrane
ME measuring unit
ME1, ME2 first and second measuring electrode
MF circumferential surface of the metal sheet
N normal to the main surface
$OF_1$, $OF_2$ main surfaces of the basic body
RB peripheral region of the metal sheet

The invention claimed is:

1. A device for generating an active haptic feedback,
having a piezoelectric actuator, which has a flat piezoelectric basic body having plane-parallel main surfaces and first and second actuator electrodes,
wherein the basic body is designed to generate an active haptic feedback when a force exerted upon the basic body is detected,
wherein the haptic feedback is generated in that an actuator voltage, which, by means of piezoelectric actuator action, results in a change in the length of the basic body along a normal to one of the main surfaces, is applied between the first and second actuator electrodes,
wherein a truncated-cone-shaped metal sheet is fastened on each of the two main surfaces of the basic body, such that the truncated cone vertex in each case faces away from the basic body, wherein the truncated cone-shaped metal sheet includes titanium,
wherein the basic body is fixed with the truncated cone vertices between a base and an actuation means, wherein the actuation is means is connected to the base and fixed by means of a bias, which is set as tensile or compressive stress.

2. The device according to claim 1, in which the actuation means is realized as an actuation plate.

3. The device according to claim 1,
wherein the truncated-cone-shaped metal sheet has a peripheral region, which is fastened on respectively one of the main surfaces of the basic body,
wherein the truncated-cone-shaped metal sheet has a circumferential surface, which projects, in the direction of the normal, over the respective main surface,
wherein at the truncated cone vertex the truncated-cone-shaped metal sheet has a top face that is aligned parallel to the surface of the basic body or that has an anatomically adapted finger depression.

4. The device according to claim 1,
wherein there is a measuring electrode arranged in the basic body,
wherein a measuring unit is provided for measuring a measurement voltage that is generated between the measuring electrode and one of the actuator electrodes and that is produced as a result of a force exerted upon the basic body, and
wherein the component is designed to detect this exerted force as soon as the measurement voltage detected by the measuring unit exceed a threshold value that is assigned to a tripping force,
wherein, upon attainment of the tripping force, an actuator voltage is generated by a voltage generator and is applied to the actuator electrodes, and in this case simultaneously a further action is tripped, which serves to operate the device or an electrical component connected thereto.

5. The device according to claim 1,
in which the actuator electrodes simultaneously also constitute the measuring electrodes,
in which the measuring unit is designed to determine the measurement voltage between the two actuator electrodes.

6. The device according to claim 1,
wherein a measuring electrode that is different from the actuator electrodes is arranged either in the middle of the basic body, between first and second actuator electrodes, or close to one of the main surfaces, such that all first and second actuator electrodes are arranged on one side of the measuring electrode.

7. The device according to claim 1, wherein the basic body has a through-hole, which extends parallel to the normal, between the two main surfaces.

8. The device according to claim 1,
wherein the main surfaces are round.

9. The device according to claim 1,
wherein the basic body has a footprint whose side lengths are between 9 and 30 mm.

10. The device according to claim 1,
wherein between the main surfaces the basic body has a height of between 0.5 and 2.0 mm.

11. The device according to claim 2, wherein the actuation plate has a greater footprint than the basic body.

12. A device, comprising a plurality of devices according to claim 1, stacked on top of each other.

13. The device according to claim 1, realized as an actuation button of an electrical component.

14. The device according to claim 1, wherein the truncated-cone-shaped metal sheet has a form of a cymbal, in which tensioned over an outwardly facing surface of the cymbal, as an actuation means, is a membrane, which, by a bias acting in the direction of a base, fixes the cymbal, and therefore also the actuator, to the base.

15. The device according to claim 2,
wherein the truncated-cone-shaped metal sheet has a peripheral region, which is fastened on respectively one of the main surfaces of the basic body,
wherein the truncated-cone-shaped metal sheet has a circumferential surface, which projects, in the direction of the normal, over the respective main surface,
wherein at the truncated cone vertex the truncated-cone-shaped metal sheet has a top face that is aligned parallel to the surface of the basic body or that has an anatomically adapted finger depression.

16. The device according to claim 1, wherein the basic body is composed of a material that includes zirconate titanate.

17. A device for generating an active haptic feedback,
comprising a piezoelectric actuator having a flat piezoelectric basic body having plane-parallel main surfaces and first and second actuator electrodes,
wherein the basic body is configured to generate an active haptic feedback in response to detection of a force exerted upon the basic body,
wherein the haptic feedback is generated in that an actuator voltage, which, by piezoelectric actuator action, results in a change in the length of the basic body along a normal to one of the main surfaces, is applied between the first and second actuator electrodes,
wherein a truncated-cone-shaped metal sheet is fastened on each of the two main surfaces of the basic body, such that the truncated cone vertex in each case faces away from the basic body, wherein the truncated cone-shaped metal sheet includes titanium,
wherein the basic body is fixed with the truncated cone vertices between a base and an actuation means, wherein the actuation means is connected to the base and fixed by a bias, which is set as tensile or compressive stress,
wherein there is a measuring electrode arranged in the basic body,
wherein a measuring unit is provided for measuring a measurement voltage that is generated between the measuring electrode and one of the actuator electrodes and that is produced as a result of a force exerted upon the basic body, and wherein the component is designed to detect this exerted force as soon as the measurement voltage detected by the measuring unit exceed a threshold value that is assigned to a tripping force, wherein, upon attainment of the tripping force, an actuator voltage is generated by a voltage generator and is applied to the actuator electrodes, and in this case simultaneously a further action is tripped, which serves to operate the device or an electrical component connected thereto, in which the actuator electrodes simultaneously also constitute the measuring electrodes, in which the measuring unit is designed to determine the measurement voltage between the two actuator electrodes.

* * * * *